United States Patent
Ravatin et al.

(10) Patent No.: US 8,174,295 B2
(45) Date of Patent: May 8, 2012

(54) CIRCUIT FOR DISCHARGING AN ELECTRICAL LOAD, POWER OUTPUT STAGE COMPRISING SUCH A DISCHARGE CIRCUIT FOR THE CONTROL OF PLASMA DISPLAY CELLS; AND RELATED SYSTEM AND METHOD

(75) Inventors: Francois Ravatin, La Murette (FR); Gilles Troussel, Grenoble (FR)

(73) Assignee: STMicroelectronics, SA, Montrouge (FR)

( * ) Notice: Subject to any disclaimer, the term of this patent is extended or adjusted under 35 U.S.C. 154(b) by 0 days.

(21) Appl. No.: 12/913,613

(22) Filed: Oct. 27, 2010

(65) Prior Publication Data
US 2011/0037752 A1   Feb. 17, 2011

Related U.S. Application Data

(60) Division of application No. 11/804,718, filed on May 18, 2007, now Pat. No. 7,843,238, which is a continuation-in-part of application No. PCT/FR2005/002801, filed on Nov. 10, 2005.

(30) Foreign Application Priority Data

Nov. 18, 2004   (FR) .................................... 04 12216

(51) Int. Cl.
    *H03B 1/00*   (2006.01)
(52) U.S. Cl. ..................................... 327/108; 327/112
(58) Field of Classification Search .................. None
    See application file for complete search history.

(56) References Cited

U.S. PATENT DOCUMENTS

| | | |
|---|---|---|
| 4,779,013 A | 10/1988 | Tanaka |
| 5,598,119 A | 1/1997 | Thayer et al. |
| 6,466,186 B1 | 10/2002 | Shimizu et al. |
| 6,751,782 B2 | 6/2004 | Levin et al. |
| 6,784,857 B1 | 8/2004 | Nakamura |
| 6,803,888 B1 | 10/2004 | Nakamura et al. |
| 7,049,863 B2 * | 5/2006 | Bechman et al. ............. 327/112 |
| 7,154,310 B2 | 12/2006 | Kojima |
| 7,319,442 B2 | 1/2008 | Nakamura et al. |
| 7,425,849 B2 * | 9/2008 | Gupta et al. ................. 327/112 |
| 7,728,788 B1 * | 6/2010 | Echols et al. ................. 345/1.3 |
| 2003/0197468 A1 * | 10/2003 | Shibata et al. ................ 313/586 |

FOREIGN PATENT DOCUMENTS

| | | |
|---|---|---|
| EP | 1087364 | 3/2001 |
| FR | 2763735 | 11/1998 |
| WO | 88/08228 | 10/1988 |

OTHER PUBLICATIONS

International Search Report for International Patent Application No. PCT/FR2005/002801, dated Feb. 24, 2006.

* cited by examiner

*Primary Examiner* — Cassandra Cox
(74) *Attorney, Agent, or Firm* — Graybeal Jackson LLP

(57) ABSTRACT

An embodiment of a discharge circuit comprises an output circuit with one output connected to an electrical load to absorb a discharge current given by the load when a logic signal commands a discharge of the load. The discharge circuit also comprises a control circuit to give the output circuit an appropriate control signal so that a slope of an output potential of the output circuit diminishes gradually when the logic signal commands a discharge of the load. Limiting the slope of the output potential gradually (and not suddenly) may limit the electromagnetic radiation generated by these variations.

20 Claims, 3 Drawing Sheets ns inCIRCUIT FOR DISCHARGING AN ELECTRICAL LOAD, POWER OUTPUT STAGE COMPRISING SUCH A DISCHARGE CIRCUIT FOR THE CONTROL OF PLASMA DISPLAY CELLS; AND RELATED SYSTEM AND METHOD

PRIORITY CLAIM

The present application is a divisional of U.S. patent application Ser. No. 11/804,718, filed May 18, 2007 now U.S. Pat. No. 7,843,238, which is a continuation-in-part application which claims priority from PCT/FR2005/002801, published in French, filed Nov. 10, 2005, based on French patent Application No. 0412216, filed Nov. 14, 2004, all the forgoing applications are incorporated herein by reference in their entireties.

BACKGROUND

1. Technical Field

An embodiment of the disclosure relates to a discharge circuit comprising an output circuit having one output connected to an electrical load, for example of a capacitive type, to absorb a discharge current given by the load when a logic signal commands a discharge of the load. An embodiment of the disclosure is especially valuable for the making of power output stages for the control of high-voltage circuits such as, for example, plasma display panels.

A plasma display panel is a matrix type screen or panel formed by cells positioned at the intersections of rows and columns. A cell comprises a cavity filled with a rare gas, two control electrodes, and a deposit of red, green or blue phosphorus. To create a light dot on the screen in using a given cell, a potential difference is applied between the control electrodes of this cell, so as to activate an ionization of the gas. This ionization is accompanied by an emission of ultraviolet rays. The creation of the light dot is obtained by the excitation of the deposited phosphorus by the emitted rays.

The cells are classically activated to create images by means of logic circuits producing control signals. The logic states of these signals determine the cells that are commanded to produce a light dot and the cells that are commanded not to produce any light. The logic circuits are generally powered at low voltage, for example voltage of 5V or less. This voltage is typically not sufficient to directly drive the electrodes of the cells. Between the logic circuits and the cells to be controlled, power output stages are therefore used to convert the low-voltage control signals into high-voltage control signals.

The ionization of the gas of the cavities typically necessitates the application of high potentials to the control electrodes, for example, about 100 V. Furthermore, it may be necessary to be able to provide the electrodes with high currents, in the range of several tens of milliamperes (and correlatively to be able to receive these currents from these electrodes). Indeed, the electrodes may be represented schematically by equivalent capacitors having relatively high capacitance values of about 100 picofarads. The controlling of the electrodes may be, therefore, equivalent to the control implemented for charging or discharging a capacitor.

In plasma display panels, it is generally desired to obtain signals (current, voltage signals) that have fast edges (i.e., rise and fall times). This represents, for example, charging or discharging times of about 100 nanoseconds. Given the high potential to be attained and the size of the capacitive charge, this entails the assumption that it is possible to provide very high charging currents and absorb very high discharge currents that could go up to about 100 milliamperes in one example.

2. Description of the Prior Art

FIG. 1 illustrates an example of a classical embodiment of an output stage used to control an electrode schematically represented by a capacitor CLoad. The stage has a potential step-up circuit (i.e., a level shifter) 10, and an output circuit 20. The circuit 10 has the function of converting a low-voltage logic control signal IN into a high-voltage logic control signal INP varying between a low voltage such as 0 V and a high-voltage VPP, and following the variations of the signal IN. The circuit 20 has a P type transistor T21 for charging the capacitor CLoad and an N type transistor T22 for discharging this capacitor CLoad. The transistor T21 is driven by the high-voltage control signal INP: when it is on, the transistor T21 gives the load CLoad a charging current, which will give rise to an increase in the potential OUT up to VPP. The transistor T22 is driven by the low-voltage control signal IN: when it is on, the transistor gives the load CLoad a discharge current proportional to the potential of the signal IN and the potential OUT decreases along a slope proportional to the discharging current. The circuit of FIG. 1 is described at greater length in French patent FR 2,763,735.

Apart from the relatively large sizeS of the transistor T22 and the transistor T21, one drawback of the circuit of FIG. 1 is the risk of simultaneous conduction of the transistors T21, T22. This risk entails major dissipation, given the values of voltage and current present in the circuit.

Yet another drawback of the circuit of FIG. 1 lies in the electromagnetic disturbances that it causes in the cells of the plasma display panel. Indeed, as seen here above, the voltage and currents brought into play are substantial and they vary in substantial proportions over very short periods of time during changes in state of the control signal. These sudden, high-amplitude variations in the voltages and currents may give rise to electromagnetic radiation that disturbs some or all of the cells of the plasma display panel.

French patent 2,763,735 also proposes another structure of an output stage that reduces the surface area needed for the charging transistor T21 and that prevents the simultaneous conduction of the transistors T21, and T22 during changes in the state of the control signal. To this end, the charging transistor T21 is replaced by a charging circuit comprising an N type transistor driven by a control circuit comprising the transistor and one diode; the charging transistor has a mode of operation similar to that of the PMOS type transistor which it replaces. But even though the size of the N type transistor is reduced relative to that of the transistor T21 of FIG. 1, the total size of the charging circuit is appreciably greater. This is because in this structure, the discharging transistor is a DMOS type transistor, which has the advantage of having particularly short power-off and power-on times, but is, on the contrary, far bulkier and furthermore requires control inverters (to introduce delays in the control signals, the delays being necessary to prevent the charging circuit and the DMOS transistor from being powered on simultaneously), which further increases the total size of the output circuit. Furthermore this circuit structure does not provide any solution to limiting the electromagnetic disturbances generated by the changes in the state of the control signal IN.

SUMMARY

An embodiment of the disclosure proposes an alternative to the prior-art output circuits that limits the electromagnetic radiation likely to disturb the downstream circuits such as the cells of a plasma display panel, and furthermore consumes little energy, and is of limited size.

As in the case of the prior-art circuits, the discharge circuit of an embodiment of the disclosure has an output circuit with one output connected to an electrical load to absorb a discharge current given by the load when a logic signal IN commands a discharge of the load.

The discharge circuit according to an embodiment of the disclosure also comprises a control circuit to give the output circuit an appropriate control signal so that a slope of an output potential of the output circuit gradually diminishes when the logic signal commands a discharge of the load.

Thus, with the control circuit according to an embodiment of the disclosure, the slope of the output potential diminishes gradually and slowly, unlike prior-art output circuits where the slope varies abruptly when the logic signal commands a discharge of the load and then remains constant.

Since the electromagnetic radiation in prior-art output circuits is typically produced by sudden and major changes in the slope of the output potential, the circuit of the disclosure limits the electromagnetic radiation by limiting the amplitude of the variations of the slope of the output potential.

For example, the discharge circuit according to an embodiment of the disclosure includes means to gradually and slowly increase a potential of the control signal when the logic signal is active. This restricts the variations of the slope of the output potential, inasmuch as the slope of the output potential is proportional to the potential of the control signal, as shall be seen more clearly here below in the examples.

An embodiment of the disclosure also relates to a power output stage for the control of an electrical load, the output stage comprising a load circuit to give the load a charging current when a logic signal commands a charging of the load. According to an embodiment of the disclosure, the power output stage also comprises a discharge circuit as described here above.

An embodiment of the disclosure also concerns a display panel comprising at least one capacitive type cell to create a light dot on the screen, and an addressing circuit to produce a logic signal for the control of the cell.

A panel according to an embodiment of the disclosure also has an output stage, as described here above, to control the cell through the control logic signal.

The panel is, for example, of the plasma panel or flat panel type.

BRIEF DESCRIPTION OF THE DRAWINGS

One or more embodiments of the disclosure will be understood and features and advantages shall appear from the following description of an exemplary mode of implementation of a discharge circuit and a power output stage. The description refers to the appended drawings, of which.

DETAILED DESCRIPTION

Figure 2:
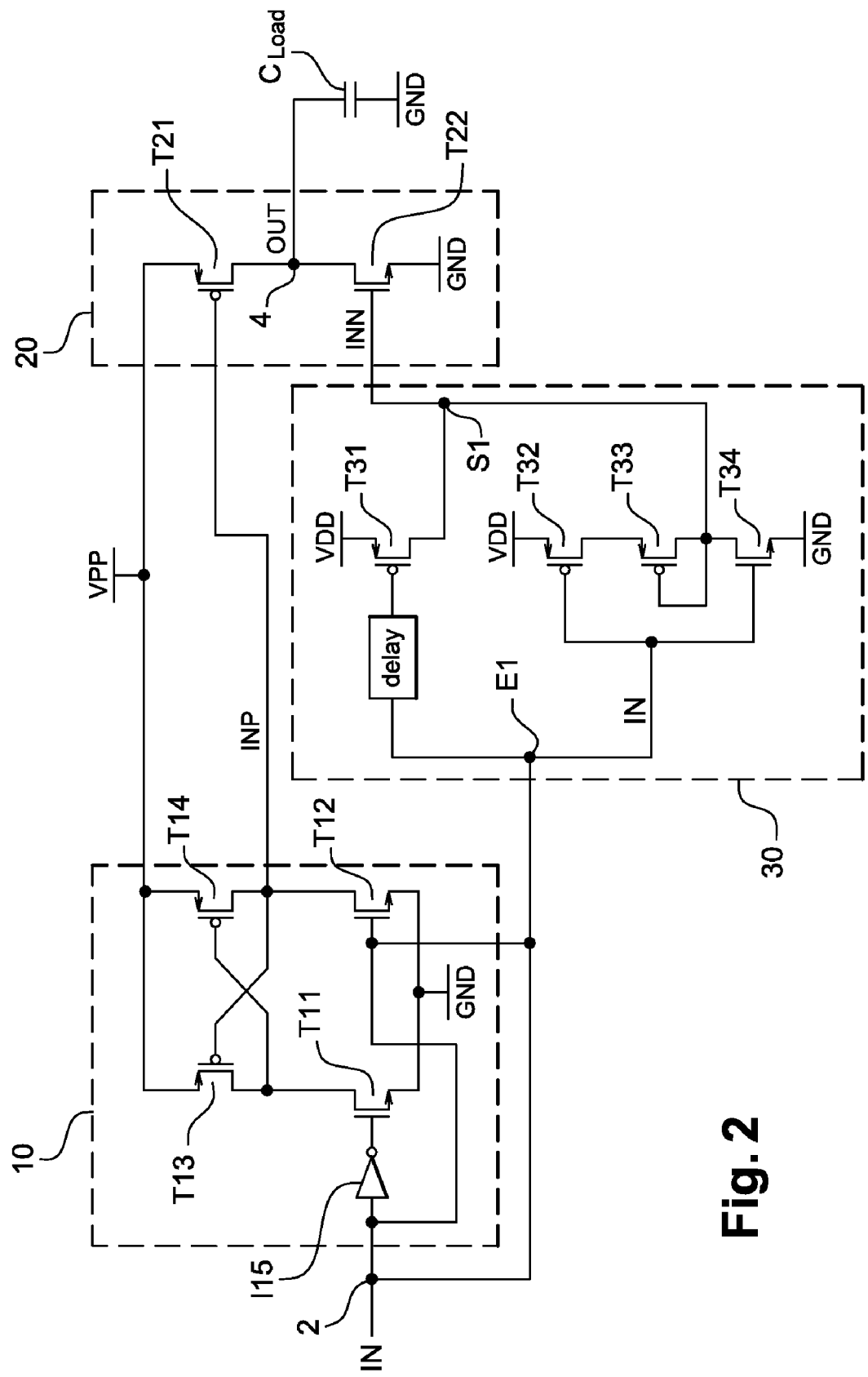
FIG. 2 illustrates an embodiment of an output stage according to the disclosure.

The output stage of FIG. 2 has a voltage step-up circuit 10, an output circuit 20, and a control circuit 30; the output stage receives an input logic signal IN at an input 2 and produces a potential OUT at a capacitive load CLoad connected with its output 4. The circuit 20 is designed to charge the load CLoad when IN is inactive (herein equal to a logic "1") and discharge the load CLoad when IN is active, herein equal to a logic "0".

The output stage receives a low-voltage power supply potential VDD, for example of about 5 V, a high-voltage power supply potential VPP, for example of about 70 to 120 V, and a reference potential GND corresponding to a ground of the circuit.

The input logic signal IN is a low-voltage logic signal, taking two logic values "0" or "1", respectively corresponding to the potential GND and to the potential VDD. The potential step-up circuit 10 and the output circuit 20 are identical to those of FIG. 1.

The circuit 10 has the function of raising the potential of the input logic signal IN, and of producing a high-voltage logic signal INP that follows the variations of the signal IN:
  INP=VPP when IN=GND (logic "0")
  INP=GND when IN=VDD (logic "1")

The output circuit 20 has a P type charging transistor T21, and an N type discharging transistor T22. The charging transistor T21 is controlled by the high-voltage control signal INP: it provides a charging current at the output 4, to bring the output potential OUT substantially to the level of the potential VPP in charging the capacitor CLoad.

The discharging transistor T22 is controlled by a low-voltage control signal INN; T22 enables the absorption of a discharge current given by the load CLoad at the output 4, to bring the output potential OUT substantially to the level of the reference potential GND. The discharging current is proportional to the potential of the signal INN at the gate of T22.

The control circuit 30 receives the input logic signal IN and, as a function of the signal IN, produces the low-voltage control signal INN, appropriate so that a slope of the output potential OUT diminishes gradually when the signal IN commands a discharge of the output (namely IN active at 0). The slope of the output potential is limited. To this end, the circuit 30 produces a signal INN which varies gradually between 0 and VDD when IN goes from 1 (VDD) to 0 (GND) so that the variations of the signal INN have a limited slope.

In the example of FIG. 2, the control circuit 30 comprises two arms parallel-connected between the input E1 of the circuit 30 to which the signal IN is applied, and the output S1 of the circuit 30 at which the signal INN is produced.

The first arm has two P type transistors T32, T33 and one N type transistor T34. The potential VDD is applied to the source of T32 whose drain is connected to the source of T33. T33 is diode-mounted; it has a gate connected to its drain, to the output S1 of the circuit 30 and to the drain of T34 whose source is connected to the ground circuit (GND potential). T33 forms a potential drop circuit: at its output (=the drain of T33) it reproduces the potential that it receives at its input (=the source of T33) minus a value VC. The set comprising the transistors T32, T33, T34 forms a potential generator controlled by the signal IN, which produces:
  GND if IN=VDD
  VDD−VC if IN=0

The second arm comprises the following, connected in series:
  a delay circuit Delay1 that reproduces the signal IN which it receives at its input but offset by a time Δ1.
  A P type transistor T31 having a drain connected to the output S1, a gate connected to the output of the circuit Delay1 and a source to which the potential VDD is applied. T31 forms a generator of a potential equal to VDD, controlled by the logic signal produced by the circuit Delay1.

The circuit 30 works as follows.

When the signal IN applied to the input E1 goes from GND (logic "0") to VDD (logic "1"), the transistor T34 swiftly comes on and takes the signal INN to the potential GND. If the transistor T31 is on, the current which flows in its channel flows toward the ground by means of the transistor T34. At the end of the period $\Delta_1$ introduced by the circuit Delay1, the signal at the gate of T31 goes to VDD and the transistor T31 goes off.

Conversely, when the signal IN goes from VDD to GND, the transistor T34 goes off and the transistor T32 swiftly comes on (switching time of the transistors in the range of 10 to 55 ns). T33 also comes on, a current flows in the transistors T32, T33 and the potential INN at the drain of T33 is drawn to VDD-VC, where VDD is the potential at the source of T32 and VC is a potential drop introduced by the diode-mounted transistor T33. VC is for example in the range of 2 V for VDD in the range of 5 V. Then, at the end of the time $\Delta_1$ introduced by the circuit Delay1, the signal at the gate of the transistor T31 also goes to GND and the transistor T31 comes on. The current flowing in T31 then draws the potential of the point S1 to VDD.

In short:
when the signal IN goes from GND to VDD, the signal INN swiftly goes from VDD to GND through the action of the transistor T34, and
when the signal IN goes from VDD to GND, the signal INN swiftly goes from GND to VDD-VC, then to VDD at the end of the period $\Delta_1$.

Thus, when IN goes from VDD to GND, the signal INN goes from GND to VDD gradually in two steps and, during the period $\Delta_1$, passes through an intermediate potential level equal to VDD-VC.

The general working of the output stage is as follows.
When the signal IN goes from GND to VDD:
the signal INN goes from VDD to GND and turns the transistor T22 off,
the signal INP goes from VPP to GND and turns on the transistor T21 which gives a charging current to the capacitor CLoad: the potential OUT gradually climbs to the value VPP.
When the signal IN goes from VDD to GND:
the signal INP goes from GND to VPP and turns the transistor T21 off,
the signal INN goes from GND to VDD-VC, then to VDD at the end of the period $\Delta_1$.

The non-zero signal INN turns on the transistor T22, which absorbs a current for discharging the capacitor CLoad, proportional to the potential of the signal INN. The discharging of the capacitor leads to a diminishing of the potential OUT in a slope that is proportional to the discharging current and therefore proportional to the potential of the signal INN.

Thus:
at the beginning, during the period $\Delta_1$, the signal INN is at the potential VDD-VC: the potential at the point OUT will therefore decrease in a first slope P1 proportional to VDD-VC,
at the end of the period $\Delta_1$, the signal INN goes to the potential VDD: the potential OUT will decrease along a second slope P2 that is proportional to VDD and therefore greater than the first slope P1.

Thus, with the control circuit 30 according to an embodiment of the disclosure, the slope of the potential OUT decreases gradually (and not suddenly as in prior-art circuits), in two steps, along two slopes: a first slight slope P1 and then a second sharper slope P2. Thus, the amplitude of the changes in curvature of the potential of the signal OUT are limited. In other words, the control circuit 30 according to an embodiment of the disclosure is used to smoothen the curve of discharge of the capacitor, and this may limit the electromagnetic disturbances at the capacitor, plasma display panel, etc.

Figure 3:
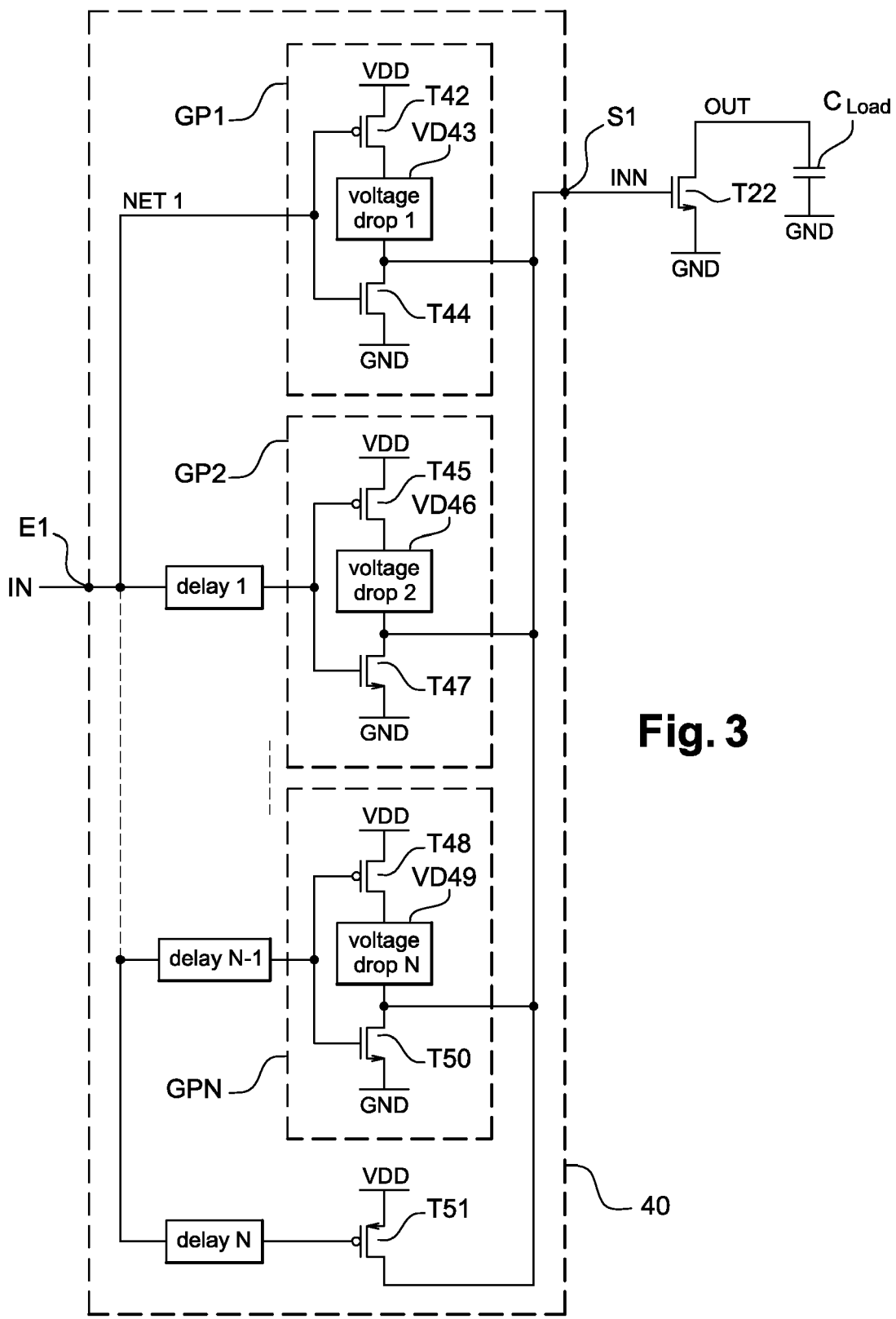
FIG. 3 shows an alternative version of a control circuit for an output stage according to FIG. 2.

FIG. 3 shows an alternate version of the control circuit of FIG. 2, used to even further smoothen the variations of the discharge curve of the capacitor CLoad, and therefore even further limit the electromagnetic disturbances at the load CLoad. FIG. 3 also shows the capacitor CLoad and the discharging transistor T22 of the output circuit the rest of the output circuit is omitted from FIG. 3.

The control circuit 40 of FIG. 3 has N+1 arms parallel-connected between the input E1 of the circuit 40 to which the signal IN is applied, and the output S1 of the circuit 40 at which the signal INN is produced. N is an integer greater than or equal to 2.

The first arm ranked n=0 has a first potential generator GP1 controlled by the signal IN: it produces a potential VDD1 ranging from GND to VDD when it receives a signal IN active at GND and it produces a potential equal to GND when it receives the signal IN inactive at VDD. The potential generator GP1 has a P type transistor T42, a potential drop circuit VD43 and an N type transistor T44. The potential VDD is applied to the source of T42 having its drain connected to an input of the circuit VD43 which has an output connected to the drain of T44 whose source is connected to the ground of the circuit (GND potential). The common gate of the transistors T42, T44 forms a control input of the generator GP1 and it is connected to the input E1 of the circuit 40; the common point of the potential drop circuit VD43 and of the transistor T44 forms an output of the generator GP1 and it is connected to the output S1 of the circuit 40.

The potential drop circuit VD43 is sized so as to cause a drop in potential VC1 such that, when the transistor T42 is on, the potential VDD1 at output of the circuit VD43 is equal to VDD1=VDD−VC1. The circuit VD43 is, for example, a diode-mounted transistor (cf. the transistor T33 in the example of FIG. 2), a diode, an electrical resistor, etc., in other words, any electrical circuit liable to cause a drop in potential, although it may be desirable to select a circuit that consumes the least energy possible.

The second arm ranked n=1 comprises the following associated in series:
a first Delay circuit Delay1, which reproduces the signal that it receives at its input at output, but offset by a period $\Delta_1$.
A second potential generator GP2 controlled by the signal produced by the circuit Delay1: the generator GP2 produces a potential VDD2 ranging from VDD1 to VDD when it receives an active signal at GND (=the signal IN offset in time by $\Delta_1$).

A delay circuit such as Delay1 may be formed, for example, by an even number of inverters associated in series.

The second potential generator GP2 is similar to the first generator GP1; the generator GP2 has a P type transistor T45, a potential drop circuit VD46 and an N type transistor T47. The potential VDD is applied to the source of T45 having its drain connected to an input of the circuit VD46 and having one output connected to the drain of T47 whose source is connected to the ground of the circuit (potential GND). The common gate of the transistors T45, T47 forms a control input of the potential generator and it is connected to the output of the circuit Delay1; the common point of the potential drop circuit VD46 and of the transistor T47 forms an output of the potential generator GP1 and it is connected to the output S1 of the circuit 40. The circuit VD46 introduces a drop in potential VC2 between the drain of T45 and the source of T47 such that VDD2=VDD−VC2.

The arms ranked n=2 to n=N−1 are made similarly to the arm ranked n=1.

They are distinguished from one another simply by the delay introduced by their delay circuit and by the potential that they produce at output. Thus, the arm ranked n (n varying between 2 and N−1) comprises the following associated in series:

a delay circuit Delay_n, which reproduces, at its output, the signal IN that it receives at its input but reproduces it offset by a period Δn ranging from Δn−1 (delay in the arm ranked n−1) to Δn+1 (delay in the arm n+1).

A potential generator GP_n+1 controlled by the signal produced by the circuit Delay_n: when it receives the signal active at GND, the generator GPn produces a potential VDDn ranging from VDD_n (potential produced by the arm ranked n−1) to VDD_n+2 (potential produced by the arm ranked n+1).

Finally, the last arm ranked n=N comprises the following associated in series:

a delay circuit Delay_N, which reproduces the signal that it receives at its input at its output but offset by a period ΔN greater than ΔN−1.

A P type transistor T51 having a drain connected to the output S1, a gate connected to the output of the circuit Delay_N and a source to which the potential VDD is applied. T31 forms a generator GPN of a potential equal to VDD, this generator being controlled by the logic signal produced by the circuit Delay_N.

The circuit 40 works as follows.

When the signal IN applied to the input E1 goes from GND (logic "0") to VDD (logic "1"), the transistor T42 goes off and the transistor T44 swiftly comes on: this transistor T44 brings the signal INN to the potential GND. At the end of the period $\Delta_1$ introduced by the circuit Delay1, the transistor T45 goes off and T47 comes on, at the end of the period ΔN−1, T48 goes off and T50 comes on, . . . , at the end of the period ΔN, T51 goes off—in one embodiment, T44 is large enough to sink the currents by GP2-GPN until these circuits stop sourcing current after the respective delay times $\Delta_2$-DN. Inversely, when the signal IN goes from VDD to GND, the transistor T44 goes off and the transistor T42 swiftly comes on (switching times of the transistors in the range of 2 ns). The potential INN at the point S1 is drawn toward VDD1=VDD−VC1 where VC1 is the potential drop introduced by the circuit VD43—in one embodiment, the circuit VD43 is large enough to source the currents sunk by GP2-GPN until these circuits stop sourcing current after the respective delay times Δ2-DN.

Then, at the end of the period $\Delta_1$ introduced by the circuit Delay1, the signal at the gate of the transistor T45 also goes to GND: T45 comes on and T47 goes off. The current flowing in the transistor T45 and in the circuit VD46 draws the potential of the point S1 to VDD2=VDD−VC2, VC2 (lower than VC1) being the drop in potential in the circuit VD46.

At the end of the period ΔN−1 introduced by the circuit Delay_N−1, the signal at the gate of the transistor T48 also goes to GND: T48 comes on and T50 goes off. The current flowing in the transistor T48 and in the circuit VD49 draws the potential of the point S1 to VDD_N=VDD−VCN, VCN (VCN is below VCN−1) ranging from 0 to VCN−1.

Finally, at the end of the period ΔN introduced by the circuit Delay_N, the signal at the gate of the transistor of T51 also goes to GND: the transistor T51 comes on and the current that flows through it draws the potential of the signal INN to VDD.

In short, when the signal IN goes from VDD to GND, the signal INN goes swiftly from GND to VDD1=VDD−VC1, then to VDD2=VDD−VC2 at the end of the period Δ1, then to VDD3=VDD−VC3 at the end of the period $\Delta_2$, . . . , then to VDD_N=VDD−VCN at the end of the period ΔN−1, and finally to VDD at the end of the period ΔN.

Thus, when IN goes from VDD to GND, the signal INN goes from GND to VDD in N+1 steps in passing successively through intermediate levels VDD1, VDD2, . . . , VDD_N, of gradually increasing levels in the course of time.

The gradual variations of the signal INN give rise to a gradual increase (N+1 successive slopes of increasing importance) of the discharge current flowing in the transistor T22 and hence equally gradual variations in the slopes of the potential OUT. The potential OUT may thus be smoothened even more efficiently than in the case of the circuit of FIG. 2, thus further limiting the electromagnetic disturbance.

Figure 1:
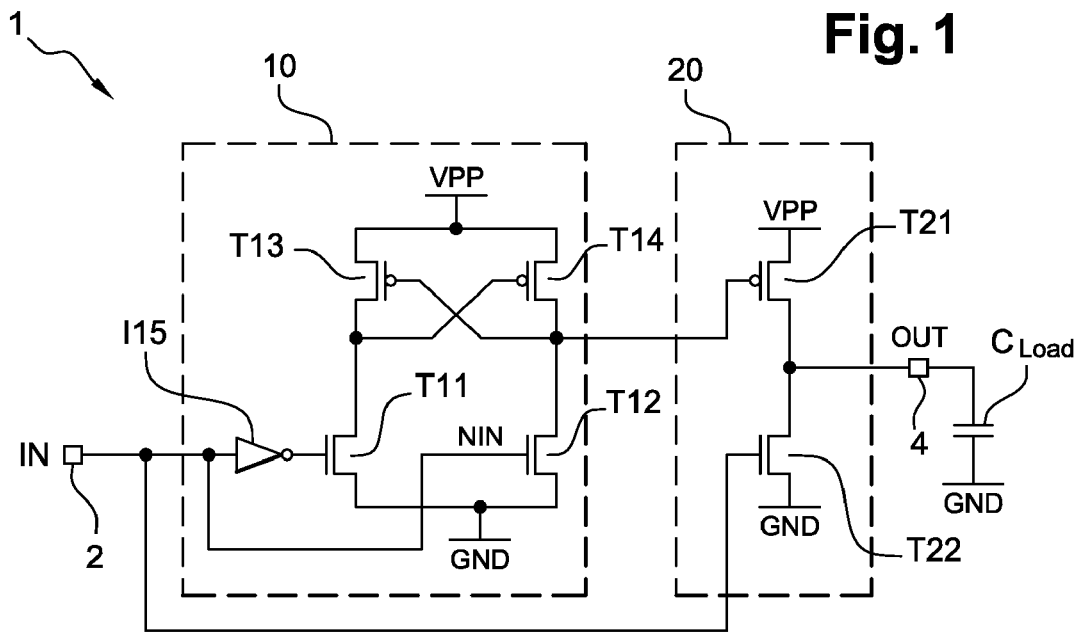
FIG. 1, already described, illustrates a prior art output stage.
Figure 4:
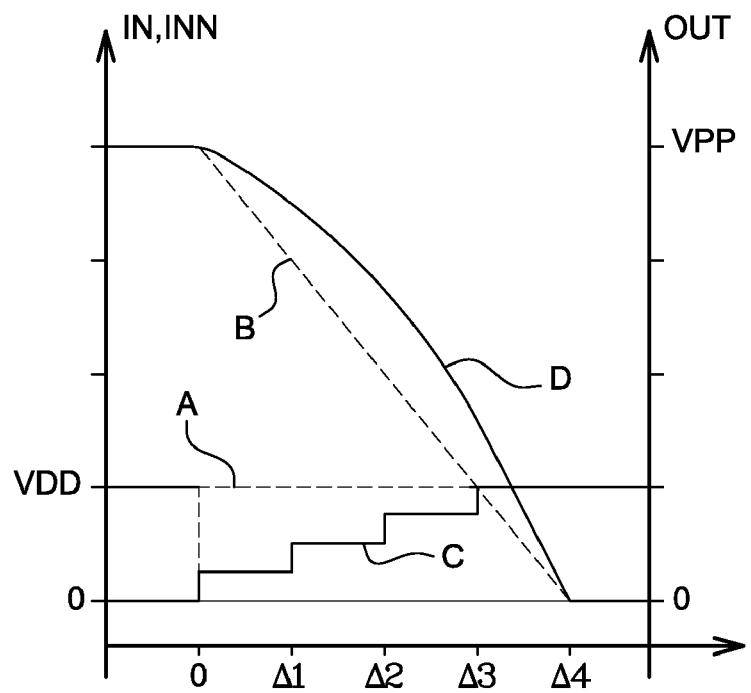
FIG. 4 shows the progress as a function of time of the output potential of the control circuit of FIG. 3.

By way of an illustrative example, FIG. 4 gives a view, when IN passes from VDD to GND, of:

the variations as a function of time of the signals INN and OUT (curves A, B shown in dashes) in the prior art circuit of FIG. 1 the variations as a function of time of the signals INN, OUT (curves C, D in solid lines) in the case of a circuit according to the disclosure, more specifically compliant with the circuit of FIG. 3, with N=3.

On the curve A, the signal INN has the shape of a potential square wave: INN passes directly from GND to VDD very swiftly, with a very short-duration transient phase (the time during which INN varies). Then INN is constant at VDD between t=0 and t=ΔN.

On the curve B, the corresponding signal OUT follows the variations of the signal INN from the curve A; OUT is at VPP up to t=0, and then OUT decreases linearly from VPP to 0 between t=0 and t=ΔN, with a constant slope proportional to INN and therefore proportional to VDD.

On the curve C, the signal INN has a staircase shape: it increases gradually and slowly from 0 to VDD in going through intermediate plateaus having increasing values VDD1, VDD2, VDD3.

On the curve D, the signal OUT follows the variations of the signal INN of the curve C: the signal OUT decreases, in the form of four straight-line portions having slopes respectively proportional to VDD1, VDD2, VDD3 and VDD, i.e. slopes that increase. It can be seen that this curve has changes in slope at the instants t=0, $\Delta_1$, $\Delta_2$, $\Delta_3$: in this example, these changes have a smaller amplitude than the amplitude of the change in slope of the curve B at the instant t=0.

A circuit according to an embodiment of the disclosure thus enables the slope of the output signal OUT to be modified slowly, in several steps corresponding to the plateaus through which the signal INN passes.

Such limited changes in amplitude of the slope of the signal OUT may limit the electromagnetic radiation that appears at the instants of the changes in slope.

In the example of FIG. 4, N has been chosen to be equal to 4. Experience shows that the theoretically ideal curve for the potential OUT, i.e. the curve theoretically entailing the smallest degree of electromagnetic radiation, is a sinusoid which can be approached by using a high value of N. In practice, the choice of N will be a compromise between low electromagnetic radiation (hence with N as a high value) and the total size of the control circuit, for which the number of arms increases naturally as a function of N.

Equally, in the example of FIG. 4, plateaus of potentials VDD1, VDD2, VDD3 have been chosen, evenly distributed between GND and VDD, and time intervals $\Delta_1$, $\Delta_2$, $\Delta_3$ evenly distributed between t=0 et T=$\Delta_4$. Naturally, all intervals of potential plateaus and time intervals can be envisaged, and it is not necessary that they should be regular. The choice may be made to minimize the electromagnetic radiation and may take account especially of the value of VDD, the value of $\Delta_4$ and the electronic components available to make the potential drop circuits and the delay circuits. One or both of the circuits of FIGS. 2 and 3 may be part of a system that includes a plasma display screen, which is driven by one or both of the circuits of FIGS. 2 and 3. Furthermore, one or both of the circuits of FIGS. 2 and 3 may have some or all of their components integrated on one or more integrated circuits which may be coupled to another integrated current such as a controller. Or, the controller and circuits of FIG. 2 and/or the circuit of FIG. 3 may be disposed on a single integrated circuit.

From the foregoing it will be appreciated that, although specific embodiments of the disclosure have been described herein for purposes of illustration, various modifications may be made without deviating from the spirit and scope of the disclosure.

What is claimed is:

1. A discharge circuit comprising an output circuit with one output connected to an electrical load to absorb a discharge current given by the load when a logic signal commands a discharge of the load, the discharge circuit also comprising a control circuit to give the output circuit an appropriate control signal so that a slope of an output potential of the output circuit diminishes at a first gradual rate when the logic signal commands a discharge of the load and at a second gradual rate after a delay time.

2. A circuit according to claim 1 wherein the control circuit comprises a circuit to increase a potential of the control signal gradually when the logic signal is active.

3. A discharge circuit comprising an output circuit with one output connected to an electrical load to absorb a discharge current given by the load when a logic signal commands a discharge of the load, the discharge circuit also comprising a control circuit to give the output circuit an appropriate control signal so that a slope of an output potential of the output circuit diminishes gradually when the logic signal commands a discharge of the load;
   wherein the control circuit comprises, parallel-connected between an input terminal to which the input logic signal is applied and an output terminal at which the control signal is produced:
   a first arm comprising a first potential generator producing a first potential lower than a power supply potential of the circuit when it receives the active logic signal,
   a second arm comprising a second potential generator producing a potential ranging between the first potential and the power supply potential when it receives the logic signal delayed by a first delay.

4. A circuit according to claim 3, wherein first potential generator comprises:
   a potential drop circuit to produce the first potential when it receives the power supply potential, and
   a switch to apply the power supply potential to the input of the potential drop circuit when the logic signal is active or to connect the output of the potential drop circuit to ground when the logic signal is inactive.

5. A circuit according to claim 4, wherein the potential drop circuit is a diode, a transistor or a resistor.

6. A circuit according to claim 4, wherein the switch comprises one or more transistors controlled by the logic signal.

7. A circuit according to claim 3, wherein the second potential generator comprises a transistor comprising a drain to which the power supply potential is applied, a source connected to the output of the control circuit and a control gate connected to the input of the control circuit.

8. A discharge circuit comprising an output circuit with one output connected to an electrical load to absorb a discharge current given by the load when a logic signal commands a discharge of the load, the discharge circuit also comprising a control circuit to give the output circuit an appropriate control signal so that a slope of an output potential of the output circuit diminishes gradually when the logic signal commands a discharge of the load;
   wherein the control circuit comprises N parallel-connected arms, N being an integer greater than or equal to 2, each arm ranked n comprising a potential generator ranked n capable of producing a potential ranked n when it receives the input logic signal delayed by a delay ranked n, n being an integer varying between 1 and N.
   the potential ranked n being:
   higher than the potential of immediately lower rank n−1 and
   lower than the potential n+1 of immediately higher rank,
   the potential generator of the arm ranked N producing the power supply potential,
   the delay ranked n being:
   greater than the immediately smaller delay ranked n−1 and smaller than the immediately greater delay ranked n+1,
   the delay in the arm ranked n=1 being zero.

9. A system, comprising:
   a display screen having a cell; and
   a driver coupled to screen, the driver comprising:
      a discharge circuit having an output coupled to the cell, the discharge circuit operable to absorb a discharge current generated by the cell during a discharge operation, and
      a control circuit operable to generate a control signal for causing a slope of an output signal from the discharge circuit to diminishes at a first rate during the discharge operation and at a second rate after a delay time.

10. The system of claim 9 wherein the display screen comprises a plasma display screen.

11. The system of claim 9, further comprising:
   wherein the driver is disposed on a first integrated circuit; and
   a controller coupled to the driver and disposed on a second integrated circuit.

12. The system of claim 9, further comprising:
   wherein the driver is disposed on an integrated circuit; and
   a controller coupled to the driver and disposed on the integrated circuit.

13. A circuit comprising:
   an input node operable to receive a logic signal indicative of a discharge operation;
   an output node connected to an electrical load and operable to absorb a discharge current given by the load when a logic signal is received at the input node; and
   a control circuit coupled to the output node and operable to generate a control signal that causes a slope of the output signal to diminish after a delay time during the discharge operation.

14. The circuit of claim 13 wherein the control circuit is further operable to increase a potential of the control signal gradually during the discharge operation.

15. A circuit comprising:
   an input node operable to receive a logic signal indicative of a discharge operation;
   an output node connected to an electrical load and operable to absorb a discharge current given by the load when a logic signal is received at the input node; and a control circuit coupled to the output node and operable to generate a control signal that causes a slope of the output signal to diminish gradually during the discharge operation;

wherein the control circuit comprises:

a first arm comprising a first potential generator producing a first potential lower than a power supply potential of the circuit when it receives the active logic signal, a second arm comprising a second potential generator producing a potential ranging between the first potential and the power supply potential when it receives the logic signal delayed by a first delay.

16. The circuit of claim 15 wherein the first arm and the second arm are parallel-connected between the input node and the output node.

17. The circuit of claim 15, wherein first potential generator comprises:

a potential drop circuit to produce the first potential when it receives the power supply potential, and a switch to apply the power supply potential to the input of the potential drop circuit when the logic signal is in a first state or to connect the output of the potential drop circuit to ground when the logic signal is in a second state.

18. The circuit of claim 15, wherein the potential drop circuit comprises one of a diode, a transistor or a resistor.

19. The circuit of claim 15, wherein the switch comprises one or more transistors controlled by the logic signal.

20. The circuit of claim 15, wherein the second potential generator comprises a transistor comprising a drain to which the power supply potential is applied, a source connected to the output of the control circuit and a control gate connected to the input of the control circuit.

* * * * *